US010032779B2

(12) United States Patent
Satou

(10) Patent No.: US 10,032,779 B2
(45) Date of Patent: Jul. 24, 2018

(54) SEMICONDUCTOR DEVICE WITH PLASMA DAMAGE PROTECTING ELEMENTS

(71) Applicant: RENESAS ELECTRONICS CORPORATION, Kanagawa (JP)

(72) Inventor: Ken Satou, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 32 days.

(21) Appl. No.: 14/134,078

(22) Filed: Dec. 19, 2013

(65) Prior Publication Data

US 2014/0175563 A1 Jun. 26, 2014

(30) Foreign Application Priority Data

Dec. 26, 2012 (JP) ................................. 2012-283696

(51) Int. Cl.
*H01L 27/088* (2006.01)
*H01L 27/108* (2006.01)
*H01L 27/02* (2006.01)

(52) U.S. Cl.
CPC .... *H01L 27/10897* (2013.01); *H01L 27/0207* (2013.01); *H01L 27/10855* (2013.01); *H01L 27/10894* (2013.01); *H01L 2924/0002* (2013.01)

(58) Field of Classification Search
CPC .......... H01L 27/10897; H01L 27/0207; H01L 27/10855; H01L 27/10894; H01L 2924/0002
USPC ........................................................ 257/401
See application file for complete search history.

(56) References Cited

U.S. PATENT DOCUMENTS

| 7,656,693 | B2 | 2/2010 | Nakamura et al. | |
|---|---|---|---|---|
| 7,879,702 | B2 | 2/2011 | Takaishi | |
| 2001/0012229 | A1* | 8/2001 | Dosaka et al. | 365/210 |
| 2002/0031006 | A1* | 3/2002 | Arimoto et al. | 365/148 |
| 2006/0203588 | A1* | 9/2006 | Ito | 365/210 |
| 2008/0014727 | A1* | 1/2008 | Takaishi | H01L 27/105 438/510 |

(Continued)

FOREIGN PATENT DOCUMENTS

| JP | 2005-259842 | | 9/2005 |
|---|---|---|---|
| JP | 2006344773 A | * | 1/2006 |

(Continued)

OTHER PUBLICATIONS

K. Miyamoto et al., "Impact of Pattern Density on Plasma Damage of CMOS LSIs," IEEE, 1996, pp. IEDM 96-739—IEDM 96-742.

(Continued)

*Primary Examiner* — Anthony Ho
*Assistant Examiner* — Mohammad M Hoque
(74) *Attorney, Agent, or Firm* — Sughrue Mion, PLLC

(57) ABSTRACT

An increase in chip area and a deterioration of delay performance are reduced without dummy cells or dummy gates for plasma damage, suppressing an increase in the capacitance of dummy cells or dummy gates and a deterioration of wiring. In the case where bit wires or bit contacts used for the DRAM cell region of a circuit block are used as wires and contacts for a logic circuit region, gate electrodes affected by plasma damage are automatically analyzed after the completion of placement and routing. The well contact region (well potential diffusion layer) of the logic circuit region contains dummy contacts for plasma damage.

12 Claims, 5 Drawing Sheets

(56) References Cited

U.S. PATENT DOCUMENTS

| | | | | |
|---|---|---|---|---|
| 2008/0239815 A1* | 10/2008 | Nakamura et al. | ...... | 365/185.13 |
| 2010/0059806 A1* | 3/2010 | Mizushima | ................... | 257/301 |
| 2010/0081395 A1* | 4/2010 | Woo | ................... | H01L 27/0207 |
| | | | | 455/73 |
| 2011/0221034 A1* | 9/2011 | Kawakita | .......... | H01L 27/10894 |
| | | | | 257/532 |
| 2011/0300697 A1* | 12/2011 | Kohira | .............. | H01L 221/2254 |
| | | | | 438/546 |
| 2012/0032242 A1* | 2/2012 | Aoki | ............................ | 257/296 |

FOREIGN PATENT DOCUMENTS

| | | | |
|---|---|---|---|
| JP | 2006-344773 A | | 12/2006 |
| JP | 2006344773 | * | 12/2006 |
| JP | 2006344773 A | * | 12/2006 |
| JP | 2008186976 | * | 1/2007 |
| JP | 2008-16705 A | | 1/2008 |
| JP | 2008-251763 A | | 10/2008 |

OTHER PUBLICATIONS

Japanese Office Action issued in Application No. 2012-283696, dated Aug. 3, 2016.

\* cited by examiner

SEMICONDUCTOR DEVICE WITH PLASMA DAMAGE PROTECTING ELEMENTS

CROSS-REFERENCE TO RELATED APPLICATIONS

The disclosure of Japanese Patent Application No. 2012-283696 filed on Dec. 26, 2012 including the specification, drawings and abstract is incorporated herein by reference in its entirety.

BACKGROUND

The present invention relates to a semiconductor device, for example, a dynamic random access memory (DRAM) process for a semiconductor device.

In a DRAM process for a logic circuit region and a DRAM cell region, an interlayer insulating film between a diffusion layer (Diffusion) and a first metal wiring layer (M1 wire) has a large thickness, increasing the height of a contact (CT) coupling the diffusion layer to the first metal wiring layer. This increases the resistance and parasitic capacitance of the contact, leading to a delay of a logic circuit region and large power consumption.

For wiring in the logic circuit region and contacts, a DRAM bit line (DBL wire) including a DRAM cell circuit between the diffusion layer and the first metal wiring layer in the DRAM cell region is proposed and a DRAM bit contact (DBLCT) coupling a DBL wiring layer to the diffusion layer is also proposed, reducing the resistance and parasitic capacitance of the contact and the delay of a logic section (Japanese Unexamined Patent Publication No. 2008-251763).

A gate coupled to a DBLCT is subjected to plasma damage by plasma charge generated in the formation of the DBLCT. Plasma damage is a failure caused by increased charge in the plasma process of thin-film device fabrication. The increased charge causes a high electric field on the gate oxide film of a transistor so as to apply a tunnel current, resulting in a break or deterioration of the gate oxide film. This directly leads to faulty transistors and a reduction in manufacturing yield.

In the case of dense DBLCTs in a DRAM cell region, however, plasma charge is dispersed to peripheral wires and DBLCTs, thereby preventing plasma damage.

Generally known plasma damage protecting elements may be peripheral wires or contacts (K Miyamoto et al., "Impact of Pattern Density on Plasma Damage of CMOS LSIs," 1996 IEEE, pp. IEDM 96-739-IEDM 96-742). Furthermore, known dummy elements for plasma damage may be contacts having no wires coupled to the tops of the contacts (Japanese Unexamined Patent Publication No. 2006-344773). Moreover, the formation of dummy contact pads in separation grooves is proposed to reduce etching residue around the separation grooves during dry etching (Japanese Unexamined Patent Publication No. 2008-016705).

Typically, the use of DBLCTs in a logic circuit region requires the insertion of plasma damage protecting elements because the contact density of the logic circuit region is lower than that of a DRAM cell region.

In the logic circuit region, however, equal gate dimensions make it difficult to dispose dummy bit contacts around an active diffusion layer including a transistor. Moreover, the placement of the dummy bit contacts increases a gate pitch, leading to a larger chip size. Dummy gates for plasma damage cannot be added to gates coupled to DBLCTs because the dummy gates affect delay performance and a chip area.

Although dummy elements for plasma damage have been conventionally known, methods for efficiently disposing the dummy elements without affecting a chip area and delay performance are not available.

SUMMARY

In a DRAM process illustrated in FIG. 1, in the case where a bit line (DBL wire) and bit contacts (DBLCTs) in a DRAM cell region are used for a logic circuit region, the logic circuit region has a low bit contact density unlike the DRAM cell region and thus disadvantageously causes plasma damage during bit metal formation.

As a dummy producing technique for reducing such plasma damage, dummy bit contacts for plasma damage are disposed in the well contact region of a logic circuit region in the manufacturing process of a semiconductor device.

The solution to plasma damage can suppress a reduction in chip area and delay performance in the layout of dummy cells and dummy gates.

DETAILED DESCRIPTION

First Embodiment

A target semiconductor device includes an inverter circuit having a relatively large size (drive capability). The inverter circuit contains a complementary metal oxide semiconductor (CMOS). The CMOS is composed of a positive channel metal oxide semiconductor (PMOS) and a negative channel metal oxide semiconductor (NMOS). The PMOS and the NMOS are both used for metal oxide semiconductor field effect transistors acting as field effect transistors (FETs).

[Layout Example of Dummy DBLCTs]

Figure 1:
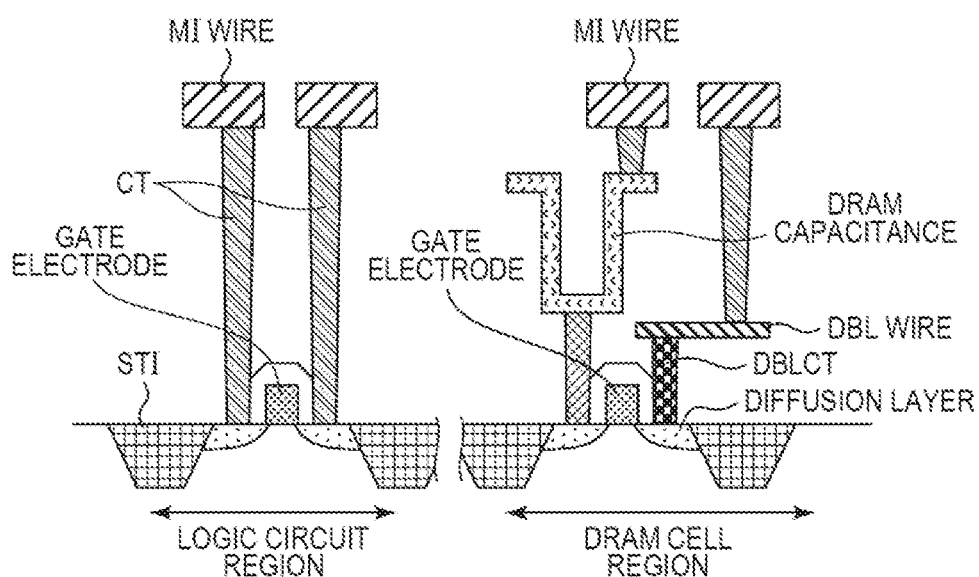
FIG. 1 is a schematic diagram of a section structure including a DRAM cell region.
Figure 2:
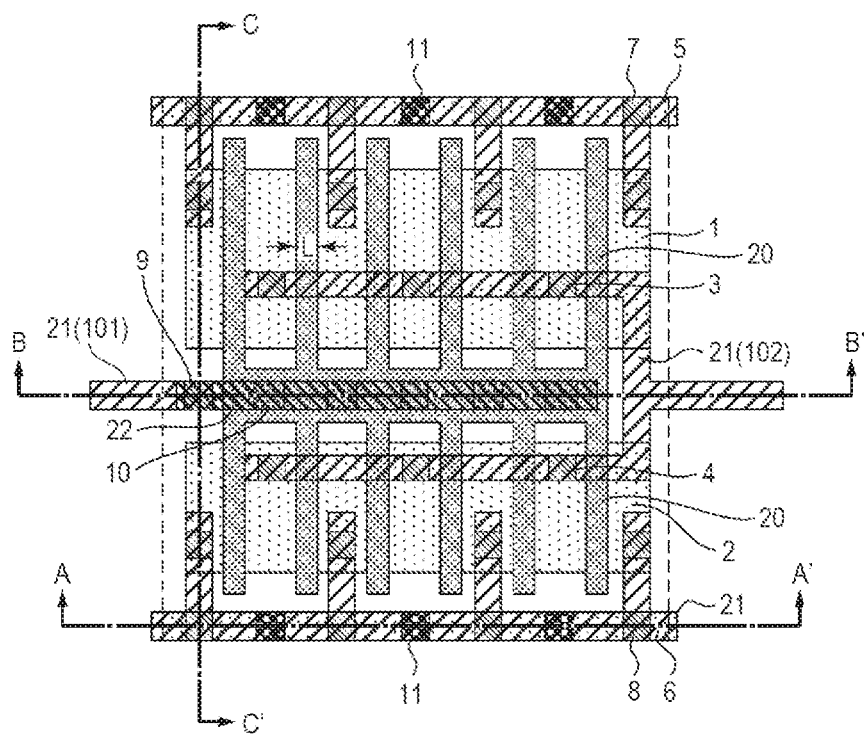
FIG. 2 shows a layout example of dummy DBLCTs according to a first embodiment.

FIG. 2 shows a layout example of dummy DBLCTs in the inverter circuit (first stage) according to a first embodiment.

As shown in FIG. 2, the inverter circuit according to the present embodiment includes a P-type active diffusion layer 1, an N-type active diffusion layer 2, contacts 3, contacts 4, an N-well upper N-type diffusion layer 5, P-well upper P-type diffusion layer 6, contacts 7, contacts 8, a contact 9, DBLCTs 10, dummy DBLCTs 11, gate electrodes 20, M1 wires 21, and a DBL wire 22.

The P-type active diffusion layer 1, the N-type active diffusion layer 2, the N-well upper N-type diffusion layer 5, the P-well upper P-type diffusion layer 6, and the gate electrodes 20 form a PMOS and an NMOS.

The P-type active diffusion layer 1 and the N-type active diffusion layer 2 are diffusion layers formed in a field region (active region) acting as a MOSFET, and are a source diffusion layer and a drain diffusion layer that correspond to the source and drain of the PMOS and the NMOS. Moreover, the P-type active diffusion layer 1 and the N-type active diffusion layer 2 form a channel between the source and drain of the PMOS and the NMOS. Comparing P-type active diffusion layer 1 and the N-type active diffusion layer 2 with the N-well upper N-type diffusion layer 5 and the P-well upper P-type diffusion layer 6, the P-type active diffusion layer 1 corresponds to a P-well upper N-type diffusion layer and the N-type active diffusion layer 2 corresponds to an N-well upper P-type diffusion layer. The explanation of shallow trench isolation (STI) is omitted.

The N-well upper N-type diffusion layer 5 and the P-well upper P-type diffusion layer 6 are TAP diffusion layers (well potential diffusion layers) for feeding a well potential. A TAP is a conductive lead coupling a well-potential diffusion layer region to a power supply. The N-well upper N-type diffusion layer 5 is an N-type diffusion layer overlying an N well of the PMOS. The P-well upper P-type diffusion layer 6 is a P-type diffusion layer overlying a P well of the NMOS. Generally, a well and a diffusion layer have different impurity concentrations. In the present embodiment, the N-well upper N-type diffusion layer 5 and the P-well upper P-type diffusion layer 6 are illustrated like belts laterally (horizontally) extended in FIG. 2. The explanation of a field oxide film is omitted.

The gate electrodes 20 are PMOS and NMOS gate electrodes. The gate electrodes 20 overlie the P well of the PMOS and the N well of the NMOS. In the example of FIG. 2, six gate wires (vertical lines) are illustrated as common gate electrodes for the P-type active diffusion layer 1 and the N-type active diffusion layer 2. The P-type active diffusion layer 1 and the N-type active diffusion layer 2 are divided into source regions (source diffusion layer) and drain regions (drain diffusion layer) at the six gate wires serving as boundaries. The six gate wires are coupled to one another in a region between the P-type active diffusion layer 1 and the N-type active diffusion layer 2 (for example, between the P well and the N well). The gate wire (horizontal line) is substantially twice as wide as one of the six gate wires (vertical lines). The explanation of a gate oxide film is omitted.

The M1 wires 21 overlie a first metal wiring layer disposed above the P-type active diffusion layer 1, the N-type active diffusion layer 2, the N-well upper N-type diffusion layer 5, the P-well upper P-type diffusion layer 6, and the gate electrode 20. The relative positional relationship of these upper and lower layers is inverted when the inverter circuit is vertically flipped. The DBL wire 22 is disposed in a DBL wire layer between the M1 wires 21 and the gate electrode 20. The explanation of an interlayer insulating film is omitted.

The contacts 3, the contacts 4, the contacts 7, and the contacts 8 are located under the M1 wires 21 (first metal wiring layer). The contacts 3 couple the P-type active diffusion layer 1 to the M1 wire 21. The contacts 4 couple the N-type active diffusion layer 2 to the M1 wire 21. The contacts 7 couple the N-well upper N-type diffusion layer 5 to the M1 wire 21. The contacts 8 couple the P-well upper P-type diffusion layer 6 to the M1 wire 21.

The P-type active diffusion layer 1 and the N-type active diffusion layer 2 are coupled to each other via the M1 wire 21. For example, the M1 wire 21 is shaped such that the end of a metal wire (horizontal line) above the P-type active diffusion layer 1 and the end of a metal wire (horizontal line) above the N-type active diffusion layer 2 are coupled to each other via a metal wire (vertical line). In other words, the M1 wire 21 has a channel shape (U shape/concave shape). One of the two metal wires extended in parallel in the channel shape (U shape/concave shape) is disposed above the P-type active diffusion layer 1. The contacts 3 overlie the metal wire disposed above the P-type active diffusion layer 1. The contacts 3 couple the M1 wire 21 to the drain region (drain diffusion layer) of the P-type active diffusion layer 1. The other of the two metal wires extended in parallel in the channel shape (U shape/concave shape) is disposed above the N-type active diffusion layer 2. The contacts 4 overlie the metal wire disposed above the N-type active diffusion layer 2. The contacts 4 couple the M1 wire 21 to the drain region (drain diffusion layer) of the N-type active diffusion layer 2. An actual configuration is not limited to this example.

The N-well upper N-type diffusion layer 5 and the P-type active diffusion layer 1 are coupled to each other via another one of the M1 wires 21. The M1 wire 21 is disposed above the overall N-well upper N-type diffusion layer 5. The M1 wire 21 branching off the positions of the contacts 7 extend above the P-type active diffusion layer 1. The branching wire is disposed in parallel with the gate wires (vertical lines) on the P-type active diffusion layer 1. The contacts 3 under the branching wires overlie the P-type active diffusion layer 1. The contacts 3 couple the M1 wire 21 to the source region (source diffusion layer) of the P-type active diffusion layer 1.

Similarly, the P-well upper P-type diffusion layer 6 and the N-type active diffusion layer 2 are couple to each other via another one of the M1 wires 21. The M1 wire 21 is disposed above the overall P-well upper P-type diffusion layer 6. The M1 wires 21 branching off the positions of the contacts 8 extend above the N-type active diffusion layer 2. The branching wires are disposed in parallel with the gate wires (vertical lines) overlying the N-type active diffusion layer 2. The contacts 4 under the branching wires overlie the N-type active diffusion layer 2. The contacts 4 couple the M1 wire 21 to the source region (source diffusion layer) of the N-type active diffusion layer 2.

In the present embodiment, the M1 wires 21 are partially used as an input terminal 101 and an output terminal 102 to be coupled to other logic circuits.

The input terminal 101 is extended from the gate electrode. In this case, the input terminal 101 is finally coupled only to the gate electrode 20 and thus the input terminal 101 is the M1 wire 21 separated from the contacts 3, the contacts 4, the contacts 7, and the contacts 8 is used. An input wire corresponding to the input terminal 101 is coupled to the DBL wire 22 via the contact 9 to reduce a parasitic wiring capacitance and a parasitic contact capacitance with an output wire corresponding to the output terminal 102. The DBL wire 22 is coupled to the gate electrode 20 via the DBLCTs 10. The gate electrode 20 is illustrated as a single gate wire (horizontal line) in a region between the P-type active diffusion layer 1 and the N-type active diffusion layer 2.

The output terminal 102 is an output wire for the active diffusion layer corresponding to a drain. In this case, the output terminal 102 is coupled to the drain regions (drain diffusion layer) of the P-type active diffusion layer 1 and the N-type active diffusion layer 2 and thus the output terminal 102 is the M1 wire 21 coupled to the drain diffusion layer via the contacts 3 and the contacts 4. In this example, the end of the metal wire (horizontal line) above the P-type active diffusion layer 1 and the end of the metal wire (horizontal line) above the N-type active diffusion layer 2 are coupled to each other via the single metal wire (vertical line) that branches to the output terminal 102. In other words, the output terminal 102 is the wire branching off a side of the channel shape (U shape/the bottom of the concave shape) of the M1 wire 21 that forms the channel shape (U shape/ concave shape). An actual configuration is not limited to this example.

In the present embodiment, the input terminal 101 and the output terminal 102 are the M1 wires. Actually, at least one of the input terminal 101 and the output terminal 102 may be the DBL wire 22 instead of the M1 wire 21. Moreover, the terminals may not be the M1 wire 21 or the DBL wire 22 and may be only electrically coupled to the M1 wire 21 and the DBL wire 22 in an actual configuration.

The contact 9 is disposed under the M1 wire 21 (input terminal 101). The contact 9 couples the M1 wire 21 to the DBL wire 22.

The DBLCTs 10 are DRAM bit contacts coupling the DBL wire 22 to the gate electrode 20. Specifically, as shown in FIG. 2, the DBLCTs 10 are provided on the DBL wire 22 and are coupled to the gate wire (horizontal line) of the gate electrodes 20 in a region between the P-type active diffusion layer 1 and the N-type active diffusion layer 2.

The dummy DBLCTs 11 are dummy bit contacts overlying the N-well upper N-type diffusion layer 5 and the P-well upper P-type diffusion layer 6. The dummy DBLCTs 11 are different from the DBLCTs 10. In the present embodiment, the contacts 7 and the dummy DBLCTs 11 are alternately disposed over the N-well upper N-type diffusion layer 5. The contacts 8 and the dummy DBLCTs 11 are alternately disposed over the P-well upper P-type diffusion layer 6. Specifically, the dummy DBLCTs 11 are dummy elements for discharging plasma charge in a sputtering process when the barrier metal of the DBLCTs 10 is formed. The barrier metal is a metal film used for preventing diffusion and an interaction of a metallic material. The contacts (e.g., the contacts 3 and 4 coupling the M1 wire to the active diffusion layer) other than the bit contacts (DBLCTs) are not formed in the formation of the bit contacts. Thus, the provision of the dummy DBLCTs 11 can release charge from the dummy DBLCTs 11 to a TAP diffusion layer or a substrate (SUB).

The dummy DBLCTs 11 are provided over the TAP diffusion layer that supplies a well potential for a primitive cell in a logic circuit. For example, a primitive cell in a typical logic circuit includes a TAP diffusion layer and thus allows the provision of dummy bit contacts without increasing an area. Even if a TAP diffusion layer is not provided in a primitive cell of a logic circuit, TAP diffusion layers are provided at certain intervals to fix a well potential and thus can similarly eliminate the need for a larger area. The dummy DBLCTs 11 provided over the TAP diffusion layer can minimize the influence of, for example, an increased capacitance on transistors and peripheral wires, thereby preventing plasma damage without deteriorating the circuit performance.

A circuit block includes the DRAM bit line wiring layer (DBL wire) and bit contacts (DBLCTs) in a peripheral circuit region with a pattern of the bit line wiring layer coupled to the gate electrode of a MOSFET, featuring dummy bit contacts (dummy DBLCTs) overlying the TAP diffusion layer for supplying a well potential.

FIG. 2 is a schematic diagram and thus dimensions in each step are not precisely shown. The dimensions in each step vary depending upon the adopted process. Generally, assuming that a gate wire corresponding to a gate electrode of a MOSFET has a width (gate width) of L, the dimensions of contacts (including DBLCTs) are about L*L to 2L*L. L*L indicates a square area whose side length is equal to the gate width. 2L*L indicates a rectangle area having a long side twice as long as the gate width and a short side as long as the gate width. Various widths (contact margins) for the provision of the contacts overlying the diffusion layer, the gate electrode layer, and the metal wiring layer are about 2L. FIG. 2 also shows a point having a contact margin of 0 (borderless contact). An actual configuration is not limited to these examples.

[Section Structure of Dummy DBLCTs Over the Diffusion Layer]

Figure 3:
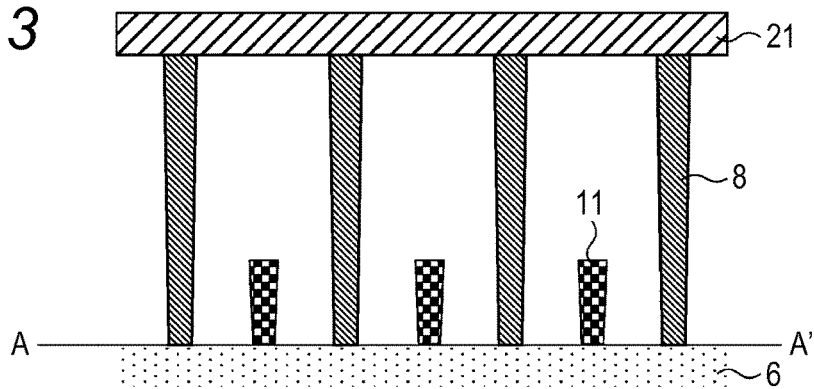
FIG. 3 is a schematic diagram of a section structure of the dummy DBLCTs.

FIG. 3 is a cross-sectional view (A-A') of the P-well upper P-type diffusion layer 6 of the NMOS including the produced dummy DBLCTs 11.

The contacts 8 are disposed to couple the P-well upper P-type diffusion layer 6 to the M1 wire 21. The dummy DBLCTs 11 for discharging plasma charge are disposed between the contacts 8. In other words, the contacts 8 and the dummy DBLCTs 11 are alternately disposed over the P-well upper P-type diffusion layer 6. The dummy DBLCTs 11 are coupled to the P-well upper P-type diffusion layer 6 but are not coupled to the M1 wire 21.

The N-well upper N-type diffusion layer 5 (not shown) is similarly provided with the dummy DBLCTs 11.

The contacts 7 are disposed to couple the N-well upper N-type diffusion layer 5 to the M1 wire 21. The dummy DBLCTs 11 for discharging plasma charge are disposed between the contacts 7. In other words, the contacts 7 and the dummy DBLCTs 11 are alternately disposed over the N-well upper N-type diffusion layer 5. The dummy DBLCTs 11 are coupled to the N-well upper N-type diffusion layer 5 but are not coupled to the M1 wire 21.

The dummy DBLCTs 11 may not have an upper wire (DBL wire 22) and thus can be efficiently disposed between typical well contacts (contacts 7 and 8). Actually, the upper wire (DBL wire 22) may be partially left.

[Section Structure of Dummy DBLCTs Over the Diffusion Layer]

Figure 4:
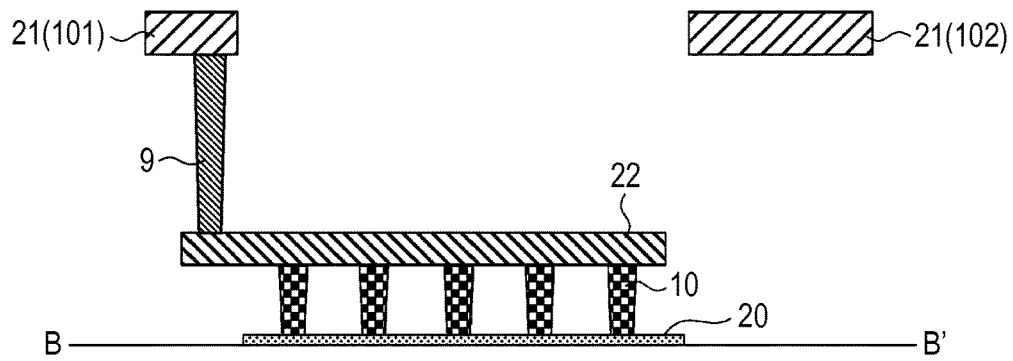
FIG. 4 is a schematic diagram showing a DBLCT section structure on a gate.

FIG. 4 shows a cross section (B-B') including the gate electrode 20 for receiving plasma charge.

The contact 9 is disposed to couple the M1 wire 21 (input terminal 101) to the DBL wire 22. The DBLCTs 10 are disposed to couple the DBL wire 22 to the gate electrode 20.

The DBLCTs 10 are disposed over the gate electrode 20. Plasma charge is disadvantageously generated in the formation of the DBLCTs 10.

[Section Structure of the Contact Over the DBL Wire]

Figure 5:
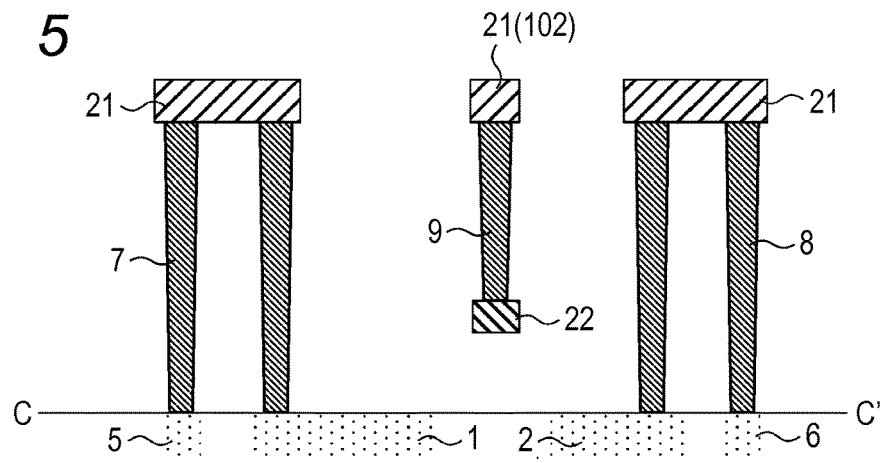
FIG. 5 is a schematic diagram showing a cross section of a contact on a DBL wire.

FIG. 5 shows a cross section (C-C') including the contact 9 on the DBL wire 22.

The contacts 7 are disposed to couple the N-well upper N-type diffusion layer 5 to the M1 wire 21. The contact 9 is disposed to couple the M1 wire 21 (input terminal 101) to the DBL wire 22. Moreover, the contacts 8 are disposed to couple the P-well upper P-type diffusion layer 6 to the M1 wire 21.

Second Embodiment

In a second embodiment, the layout of an N-well upper N-type diffusion layer 5 and a P-well upper P-type diffusion layer 6 is changed from that of the inverter circuit described in the first embodiment.

[Layout Example of Dummy DBLCTs]

Figure 6:
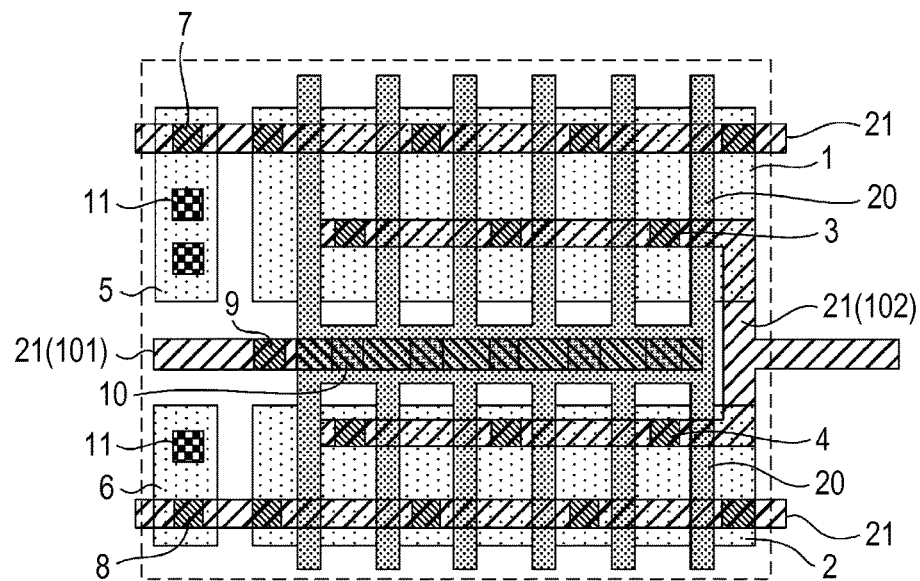
FIG. 6 shows a layout example of dummy DBLCTs according to a second embodiment.

FIG. 6 shows a layout example of dummy DBLCTs in an inverter circuit (first stage) according to the present embodiment.

The N-well upper N-type diffusion layer 5 and the P-well upper P-type diffusion layer 6 may be disposed on the left and right of a logic circuit (or the inverter circuit). In the example of FIG. 6, the N-well upper N-type diffusion layer 5 and the P-well upper P-type diffusion layer 6 are disposed on the left of the logic circuit (or the inverter circuit).

The N-well upper N-type diffusion layer 5 and a P-type active diffusion layer 1 are coupled to each other via an M1 wire 21. The M1 wire 21 is perpendicular to gate wires (vertical lines) above the P-type active diffusion layer 1. Contacts 3 coupling the P-type active diffusion layer 1 to the M1 wire 21 overlie the P-type active diffusion layer 1. A contact 7 coupling the N-well upper N-type diffusion layer 5 to the M1 wire 21 overlies the N-well upper N-type diffusion layer 5. Moreover, dummy DBLCTs 11 for discharging plasma charge overlie the N-well upper N-type diffusion layer 5. In the present embodiment, a wiring layer is not provided above the dummy DBLCTs 11.

The P-well upper P-type diffusion layer 6 is disposed on the left of the N-type active diffusion layer 2. The P-well upper P-type diffusion layer 6 and the N-type active diffusion layer 2 are coupled to each other via the M1 wire 21. The M1 wire 21 is perpendicular to gate wires (vertical lines) above the N-type active diffusion layer 2. Contacts 4 coupling the N-type active diffusion layer 2 to the M1 wire 21 overlie the N-type active diffusion layer 2. The contacts 4 couple the M1 wire 21 to a drain region (drain diffusion layer) in the N-type active diffusion layer 2. A contact 8 coupling the P-well upper P-type diffusion layer 6 to the M1 wire 21 overlies the P-well upper P-type diffusion layer 6. Furthermore, the dummy DBLCT 11 for discharging plasma charge overlies the P-well upper P-type diffusion layer 6. In the present embodiment, a wiring layer is not provided above the dummy DBLCT 11.

[Explanation a of the Explanation of the Diffusion Layer]

From a certain point of view, the N-well upper N-type diffusion layer 5 and the P-well upper P-type diffusion layer 6 are disposed in the direction of extending an input terminal 101 (an input wire drawn from the gate electrode) with respect to the P-type active diffusion layer 1 and the N-type active diffusion layer 2. The N-well upper N-type diffusion layer 5 and the P-well upper P-type diffusion layer 6 may be disposed in the direction of extending an output terminal 102 (the output wire of an active diffusion layer) with respect to the N-well upper N-type diffusion layer 5 and the P-well upper P-type diffusion layer 6, which is not shown. In other words, the N-well upper N-type diffusion layer 5 and the P-well upper P-type diffusion layer 6 are disposed in at least one of the direction of extending the input terminal 101 (to the left in FIG. 6) and the direction of extending the output terminal 102 (to the right in FIG. 6) with respect to the P-type active diffusion layer 1 and the N-type active diffusion layer 2.

[Explanation B of the Explanation of the Diffusion Layer]

From another point of view, the N-well upper N-type diffusion layer 5 and the P-well upper P-type diffusion layer 6 are disposed perpendicularly (laterally in FIG. 6) to the direction of extending the P-type active diffusion layer 1 and the N-type active diffusion layer 2 (vertically in FIG. 6).

[Explanation of the Layout of the Dummy DBLCTs]

The contacts 3 are disposed in one direction on the M1 wire 21 above the P-type active diffusion layer 1 and the N-well upper N-type diffusion layer 5. The dummy DBLCTs 11 overlying the N-well upper N-type diffusion layer 5 are disposed perpendicularly (vertically in FIG. 6) to the direction of arranging the contacts 3 (laterally in FIG. 6). Similarly, the contacts 4 are disposed in one direction over the M1 wire 21 above the N-type active diffusion layer 2 and the P-well upper P-type diffusion layer 6. The dummy DBLCT 11 overlying the P-well upper P-type diffusion layer 6 is disposed perpendicularly (vertically in FIG. 6) to the direction of arranging the contacts 4 (laterally in FIG. 6).

Other configurations are basically identical to those of the first embodiment.

As in the first embodiment, the dummy DBLCT 11 disposed in a well potential diffusion layer region can be used as a dummy element for discharging plasma charge in the present embodiment. The dummy DBLCT 11 can be disposed in the existing well potential diffusion layer without increasing a logic circuit area.

Third Embodiment

A third embodiment will describe a layout example of a plurality of inverter circuits instead of a single inverter circuit.

[Layout Example of Dummy DBLCTs]

Figure 7:
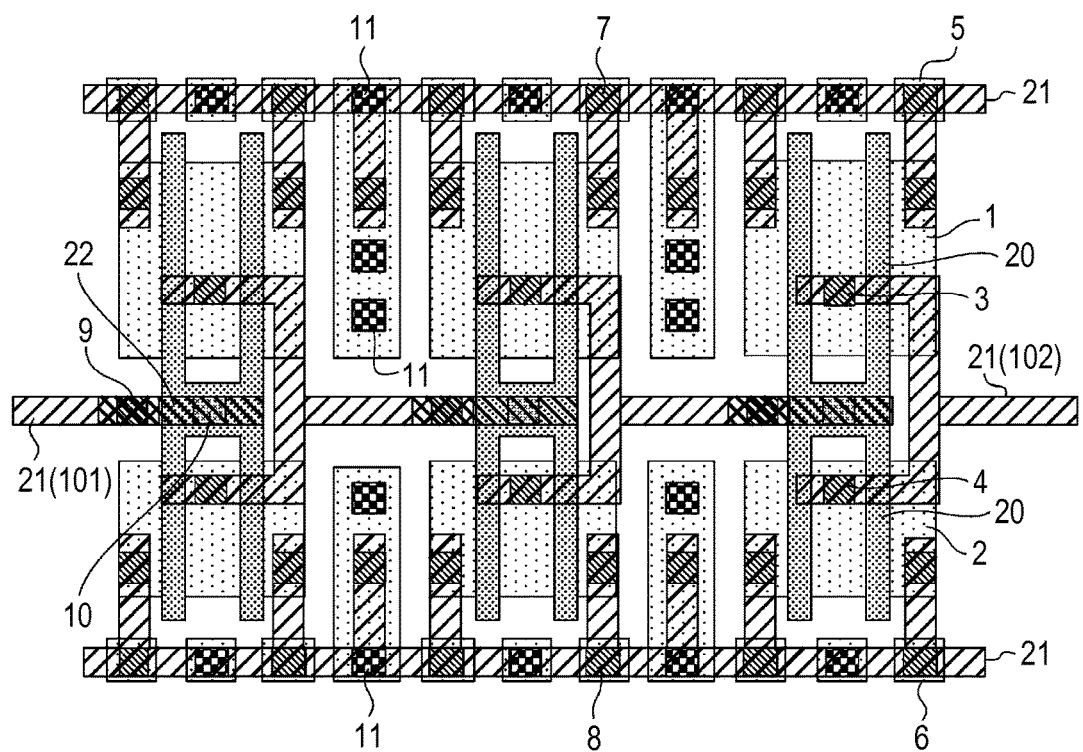
FIG. 7 shows a layout example of dummy DBLCTs according to a second embodiment.

FIG. 7 shows a layout example of dummy DBLCTs in the inverter circuits (three stages) according to the present embodiment. The three stages are merely exemplary and thus the inverter circuits may be actually provided in two stages or more than three stages.

In the example of FIG. 7, gate electrodes 20 of transistors (PMOS and NMOS) including the inverter circuit are illustrated as two gate wires (vertical lines) shared by a P-type active diffusion layer 1 and an N-type active diffusion layer 2. The P-type active diffusion layer 1 and the N-type active diffusion layer 2 are each divided into a source region (source diffusion layer) and a drain region (drain diffusion layer) at the two gate wires. The two gate wires are coupled to each other via a gate wire (horizontal line) in a region between the P-type active diffusion layer 1 and the N-type active diffusion layer 2. In other words, in the present embodiment, the gate electrodes 20 shaped like a "letter H". The two parallel gate wires (vertical lines) in the upper part of the letter H are disposed on the P-type active diffusion layer 1. The two parallel gate wires (vertical lines) in the lower part of the letter H are disposed on the N-type active diffusion layer 2. The gate wire (horizontal line) at the center of the letter H is located between the P-type active diffusion layer 1 and the N-type active diffusion layer 2. A DBL wire 22 is disposed above the gate wire at the center of the letter H. A DBLCT 10 overlies the DBL wire 22. The DBLCT 10 is a DRAM bit contact coupling the DBL wire 22 to the gate wire (gate electrode 20) at the center of the letter H. An M1 wire 21 (input terminal 101) is disposed above the DBL wire 22. A contact 9 is disposed under the M1 wire 21 (first metal wiring layer). The contact 9 couples the M1 wire 21 (input terminal 101) to the DBL wire 22.

The P-type active diffusion layer 1 and the N-type active diffusion layer 2 are coupled to each other via the M1 wire 21. For example, the M1 wire 21 is shaped such that the end of a metal wire (horizontal line) above the P-type active diffusion layer 1 and the end of a metal wire (horizontal line) above the N-type active diffusion layer 2 are coupled to each other via a metal wire (vertical line). In other words, the M1 wire 21 has a channel shape (U shape/concave shape). One of the two metal wires extended in parallel in the channel shape (U shape/concave shape) is disposed above the P-type active diffusion layer 1. A contact 3 overlies the metal wire disposed above the P-type active diffusion layer 1. The other of the two metal wires extended in parallel in the channel shape (U shape/concave shape) is disposed above the N-type active diffusion layer 2. A contact 4 overlies the metal wire disposed above the N-type active diffusion layer 2. The contact 4 couples the M1 wire 21 to the drain region (drain diffusion layer) of the N-type active diffusion layer 2. In the present embodiment, as in other embodiments, the end of the metal wire (horizontal line) above the P-type active diffusion layer 1 and the end of the metal wire (horizontal line) above the N-type active diffusion layer 2 are coupled to each other via the single metal wire (vertical line) that branches to an output terminal 102. In other words, the output terminal 102 is the wire branching off a side of the channel shape (U shape/the bottom of the concave shape) of the M1 wire 21 that forms the channel shape (U shape/concave shape). An actual configuration is not limited to this example.

In FIG. 7, the output terminal 102 in the inverter circuit of the first stage (the left side of FIG. 7) is used as the input terminal 101 in the inverter circuit of the second stage (at the center of FIG. 7). Similarly, the output terminal 102 in the inverter circuit of the second stage (at the center of FIG. 7) is used as the input terminal 101 in the inverter circuit of the third stage (the right side of FIG. 7). In other words, in FIG. 7, the inverter circuits from the first stage (the left side of FIG. 7) to the third stage (the right side of FIG. 7) are coupled in three stages. An actual configuration is not limited to this example.

In the first embodiment, the N-well upper N-type diffusion layer 5 of the PMOS and the P-well upper P-type diffusion layer 6 of the NMOS are illustrated like "belts", whereas in the present embodiment, diffusion layers are divided into "dots" (dotted line/broken line). Actually, as in the first embodiment, the diffusion layers may be shaped like "belts".

In the present embodiment, contacts 7 and dummy DBLCTs 11 are alternately disposed with respect to the N-well upper N-type diffusion layer 5 shaped like dots. The M1 wire 21 is disposed above the N-well upper N-type diffusion layer 5 shaped like dots. The contacts 7 coupling the N-well upper N-type diffusion layer 5 to the M1 wire 21 are spaced at equal intervals (every dot of the N-well upper N-type diffusion layer 5) under the M1 wire 21 (first metal wiring layer). Moreover, the M1 wire 21 branches at the position of the contact 7 over the N-well upper N-type diffusion layer 5 and extends above the P-type active diffusion layer 1. The contacts 7 coupling the branching wire to the P-type active diffusion layer 1 are disposed over the branching wire. Furthermore, the P-type active diffusion layer 1 and the N-well upper N-type diffusion layer 5 are joined in a region between PMOS transistors (between the stages of the inverter circuits). In this region, the M1 wire 21 above the N-well upper N-type diffusion layer 5 branches at the position of the dummy DBLCT 11 overlying the N-well upper N-type diffusion layer 5. The contact 7 coupling the branching wire to the region overlies the branching wire. Additional dummy DBLCTs 11 are provided over this region.

Similarly, contacts 8 and dummy DBLCTs 11 are alternately disposed with respect to the P-well upper P-type diffusion layer 6 shaped like dots. The M1 wire 21 is disposed above the P-well upper P-type diffusion layer 6 shaped like dots. The contacts 8 coupling the P-well upper P-type diffusion layer 6 to the M1 wire 21 are spaced at equal intervals (every dot of the P-well upper P-type diffusion layer 6) under the M1 wire 21 (first metal wiring layer). Moreover, the M1 wire 21 branches at the position of the contact 8 on the P-well upper P-type diffusion layer 6 and extends above the N-type active diffusion layer 2. The contacts 8 coupling the branching wire to the N-type active diffusion layer 2 are disposed over the branching wire. Furthermore, the N-type active diffusion layer 2 and the P-well upper P-type diffusion layer 6 are joined in a region between NMOS transistors (between the stages of the inverter circuits). In this region, the M1 wire 21 above the P-well upper P-type diffusion layer 6 branches at the position of the dummy DBLCT 11 on the P-well upper P-type diffusion layer 6. The contacts 8 coupling the branching wire to the region are provided over the branching wire. Additional dummy DBLCTs 11 are provided over this region.

Other configurations are basically identical to those of the foregoing embodiments.

The present embodiment features the well potential diffusion layer and the dummy DBLCTs 11 that are provided on the side of the source diffusion layer of the MOSFET including the inverter circuit. This configuration can achieve more efficient discharge.

Common Items of the Embodiments

An example of wiring used as the input terminal 101 and the output terminal 102 will be described below according to the accompanying drawings.

[The Position of the Used Inverter in the Logic Circuit]

FIG. 8 shows the example of the position of the used inverter circuit in the logic circuit (a functional block or macro).

In the foregoing embodiments, the M1 wires are used as the input terminal 101 and the output terminal 102. The M1 wires 21 used as the input terminal 101 and the output terminal 102 may be replaced with the DBL wires 22.

Figure 8A:
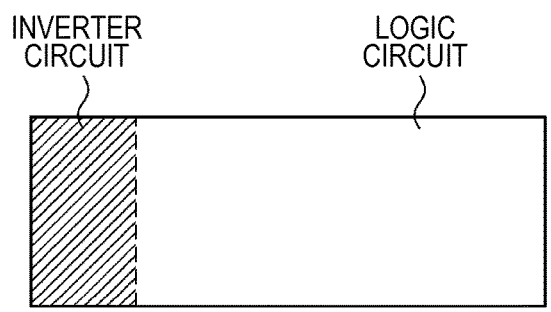
FIGS. 8A, 8B and 8C show examples of the positions of a used inverter circuit in a logic circuit.

In FIG. 8A, the wires are used in the input first stage of the logic circuit. In this case, the input terminal 101 to be coupled to other logic circuits is the M1 wire 21 while the output terminal 102 to be coupled to an adjacent transistor (subsequent-stage logic circuit transistor) in the logic circuit is the DBL wire 22.

Figure 8B:
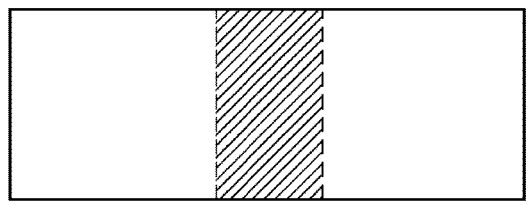

In FIG. 8B, the wires are used at the center of the logic circuit. In this case, the DBL wires 22 are used as the input terminal 101 and the output terminal 102 to be coupled to adjacent transistors (logic circuit transistors in the preceding and subsequent stages).

Figure 8C:
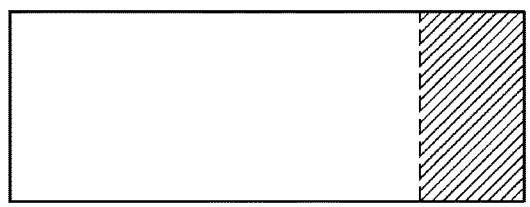

In FIG. 8C, the wires are used in the output of the logic circuit. In this case, the input terminal 101 to be coupled to an adjacent transistor (preceding-stage logic circuit transistor) is the DBL wire 22 while the output terminal 102 to be coupled to other logic circuits is the M1 wire 21.

The Relationship of the Embodiments

The foregoing embodiments may be combined. For example, the circuit configuration may vary with the cell or block (each of the embodiments).

SUMMARY

Main points of the explanation will be briefly described below.

[Sputtering on the Bit Contact]

Figure 9:
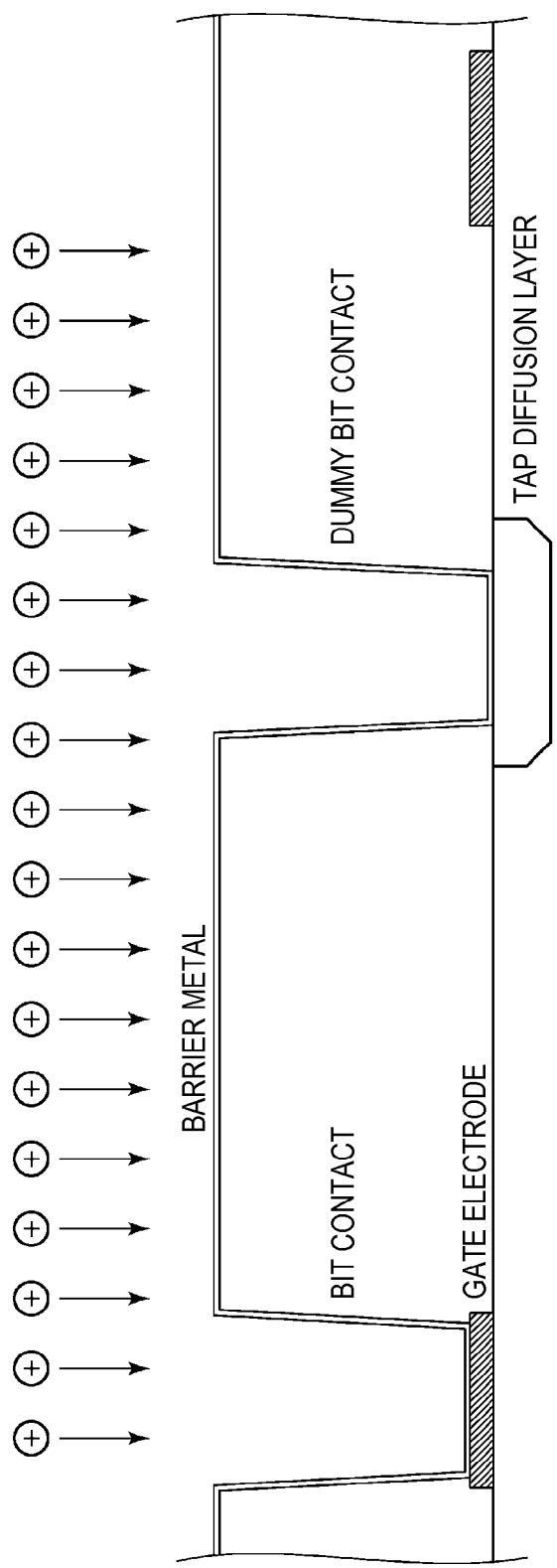
FIG. 9 is an explanatory drawing of sputtering on a bit contact.

FIG. 9 shows an example of sputtering in the formation of the barrier metal of the bit contact.

Even if plasma charge is generated during sputtering in the formation of the barrier metal of the bit contact, the dummy bit contacts can release charge from the dummy bit contacts to the TAP diffusion layer or the SUB. The contacts other than the bit contacts are not formed in the formation of the bit contacts.

For example, the DRAM bit line (DBL wire) and the DRAM bit contact (DBLCT) used in the DRAM cell region are used as a wire and a contact for the logic circuit region. After the completion of placement and routing, the gates affected by plasma damage are automatically analyzed. Furthermore, the dummy bit contacts for plasma damage are automatically produced and placed in the well contact region (well potential diffusion layer) of the logic circuit region.

This eliminates the need for dummy wires, dummy cells, dummy gate, and so on for plasma damage, suppressing an increase in chip area and a deterioration of delay performance (an increase in circuit delay). Thus, the dummy DBLCTs for plasma discharge can be efficiently placed in the well contact region. Moreover, the dummy bit contact having this structure can also eliminate the need for wiring on the contact, thereby suppressing an increase in the capacitance of the dummy bit contact or a deterioration of wiring.

Remark

The embodiments of the present invention were described in detail. Actually, the present invention is not limited to the embodiments and thus includes changes within the scope of the present invention.

What is claimed is:

1. A semiconductor device comprising:
   a well potential diffusion layer disposed in a circuit block having a pattern of a DRAM bit line wiring layer coupled to a gate electrode of a MOSFET via a bit contact; and
   dummy bit contacts disposed directly over the well potential diffusion layer in a logic circuit region,
   wherein the dummy bit contacts are electrically uncoupled from a wire formed directly above the dummy bit contacts.

2. The semiconductor device according to claim 1, wherein contacts to be coupled to an upper wire and the dummy bit contacts are alternately disposed over the well potential diffusion layer.

3. The semiconductor device according to claim 1, wherein with respect to an active diffusion layer forming the MOSFET, the well potential diffusion layer is disposed in at least one of a direction of extending an input wire into the gate electrode and a direction of extending an output wire of the active diffusion layer, and
   the dummy bit contacts are disposed over the well potential diffusion layer perpendicularly to a direction of arranging the contacts to be coupled to the upper wire.

4. The semiconductor device according to claim 1, wherein the well potential diffusion layer is dot shaped, and contacts to be coupled to an upper wire and the dummy bit contacts are alternately disposed for each dot according to the dot-shaped well potential diffusion layer.

5. The semiconductor device according to claim 1, wherein the dummy bit contacts are element electrically uncoupled to an upper wiring layer.

6. A semiconductor device comprising:
   a memory circuit region including:
      a diffusion layer;
      a bit line wiring layer;
      a bit contact formed between said bit line wiring layer and said diffusion layer; and
   a logic circuit region including:
      a well potential diffusion layer;
      a first wiring layer coupled to a first transistor;
      a first contact disposed directly over said well potential diffusion layer in the logic circuit region, wherein said bit line wiring layer and said first wiring layer are formed on the same wiring layer level,
   wherein the first contact is electrically uncoupled from a wire formed directly above the first contact.

7. The semiconductor device according to claim 6, wherein said first wiring layer is coupled to a gate electrode of said first transistor.

8. The semiconductor device according to claim 6, further comprises a second contact in said logic circuit region that is disposed over said well potential diffusion layer, and a second wiring layer coupled to said well potential diffusion layer through said second contact,
   wherein said second wiring layer is formed above said first wiring layer.

9. The semiconductor device according to claim 1, wherein the dummy bit contacts are disposed in a first layer level directly over the well potential diffusion layer, and the dummy bit contacts do not contact any second layer level formed above the first layer level.

10. The semiconductor device according to claim 6, wherein the first contact is disposed in a first layer level directly over the well potential diffusion layer, and the first contact does not contact any second layer level formed above the first layer.

11. The semiconductor device according to claim 1, wherein the dummy bit contacts are electrically uncoupled from the wire formed directly above the dummy bit contacts in a cross-sectional view.

12. The semiconductor device according to claim 6, wherein the first contact are electrically uncoupled from the wire formed directly above the first contact in a cross-sectional view.

* * * * *